(12) United States Patent
Jones

(10) Patent No.: US 8,716,840 B2
(45) Date of Patent: May 6, 2014

(54) BACKSIDE THERMAL PATTERNING OF BURIED OXIDE (BOX)

(75) Inventor: Richard Jones, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/060,177

(22) Filed: Mar. 31, 2008

(65) Prior Publication Data

US 2013/0134561 A1 May 30, 2013

(51) Int. Cl.
*H01L 29/02* (2006.01)
*H01L 21/311* (2006.01)

(52) U.S. Cl.
USPC .......................................... 257/632

(58) Field of Classification Search
None
See application file for complete search history.

(56) References Cited

U.S. PATENT DOCUMENTS 6,531,741 B1* 3/2003 Hargrove et al. ............. 257/350
2005/0242398 A1* 11/2005 Chen et al. .................... 257/348

* cited by examiner

*Primary Examiner* — Matthew W Such
*Assistant Examiner* — Robert Carpenter
(74) *Attorney, Agent, or Firm* — Blakely, Sokoloff, Taylor & Zafman LLP

(57) ABSTRACT

The dominant source of thermal resistance for silicon photonic devices patterned on SOI wafers is the buried oxide layer. To ensure efficient thermally driven silicon devices there is a need for a large thermal resistance. This is in contrast to temperature sensitive components need to have low thermal resistance in order to reduce their temperature to ensure good performance. Embodiments comprise etching the back of an SOI wafer to expose the buried oxide layer and depositing an additional layer of silicon oxide to increase the local thermal resistance. Thus, embodiments provide the ability to tailor the thermal resistance across the wafer or die depending on the device being fabricated.

9 Claims, 4 Drawing Sheets

BACKSIDE THERMAL PATTERNING OF BURIED OXIDE (BOX)

FIELD OF THE INVENTION

Embodiments of the present invention are directed to controlling the thermal resistance of a silicon on insulator (SOI) wafer and, more particularly, to varying the thermal resistance profile at desired spots on the wafer.

BACKGROUND INFORMATION

The dominant source of thermal resistance for silicon photonic devices patterned on silicon on insulator (SOI) wafers is the buried oxide layer. Different devices patterned near each other in the same wafer may have different thermal needs. To ensure efficient thermally driven silicon devices there is a need for a large thermal resistance. This is in contrast to temperature sensitive components, for example lasers, that need to have low thermal resistance in order to reduce their temperature to ensure good performance. The ideal situation would be the ability to tailor the thermal resistance across the wafer or die depending on the device being fabricated.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
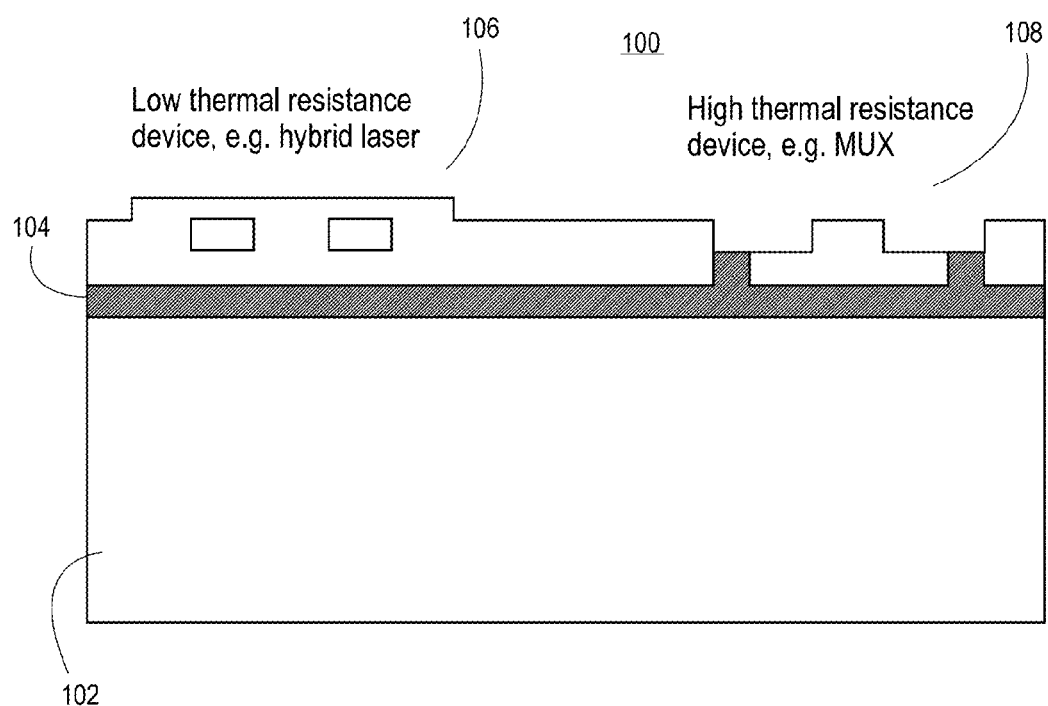
FIG. 1 is an SOI wafer having a uniform thermal resistance profile.

Referring now to FIG. 1, there is shown a silicon on insulator (SOI) 100 wafer with two devices formed thereon. The SOI wafer 100 includes a single crystalline silicon substrate 102 having an insulating layer 104, such as a buried oxide formed thereon.

As previously noted, many devices may be formed on an SOI wafer 100 and, each of these devices may have very different thermal specifications. As shown in FIG. 1, a low resistance thermal device 106, such as a hybrid laser may be formed on one area of the wafer 100, and adjacent to it may be formed a high thermal resistance device 108, such as a thermally tuned multiplexer (MUX).

For the low thermal resistance device 106 (e.g. the laser), the thinnest buried oxide that may be used without incurring additional loss due to leakage into the substrate is typically 1 μm thick for silicon waveguides of 1.5 μm dimensions. In contrast, for the high thermal resistant device 108 (e.g. thermally tuned MUX), a 1μm thick buried oxide layer may not be thick enough to fabricate an efficient device.

Figure 2A:
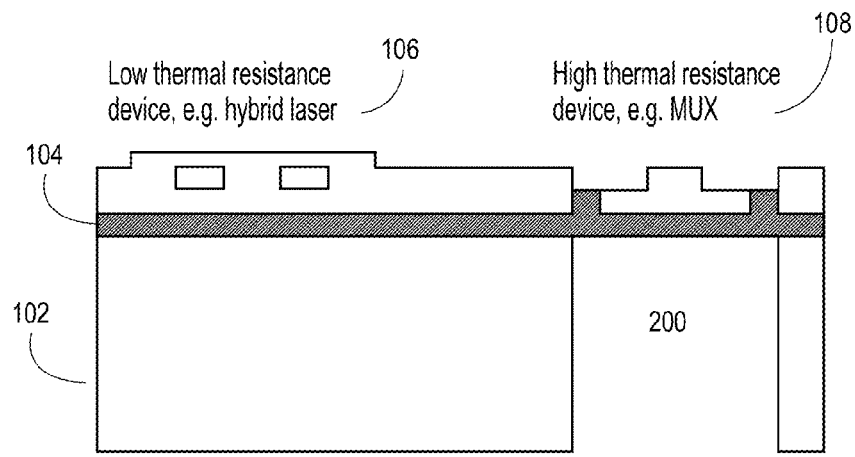
FIGS. 2A, 2B, and 2C depict an SOI wafer being made to have a tailored thermal resistance profile according to one embodiment.
Figure 2B:
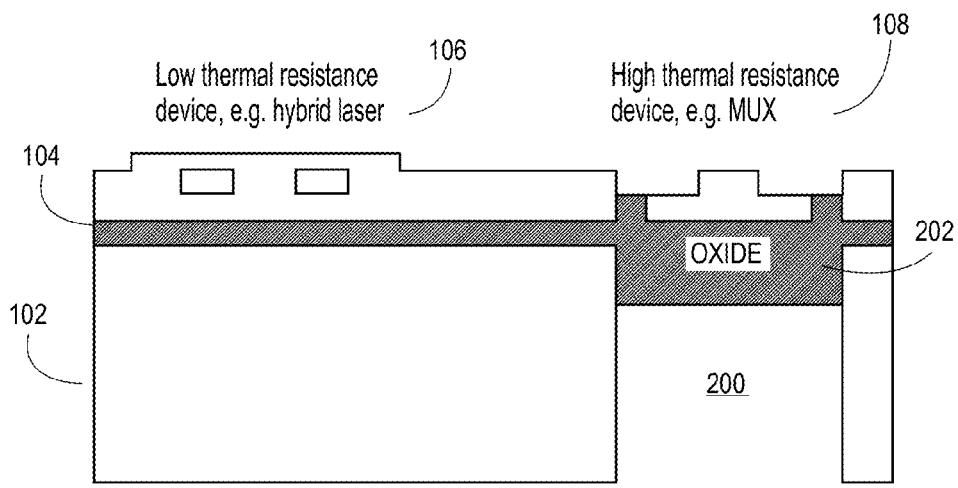
Figure 2C:
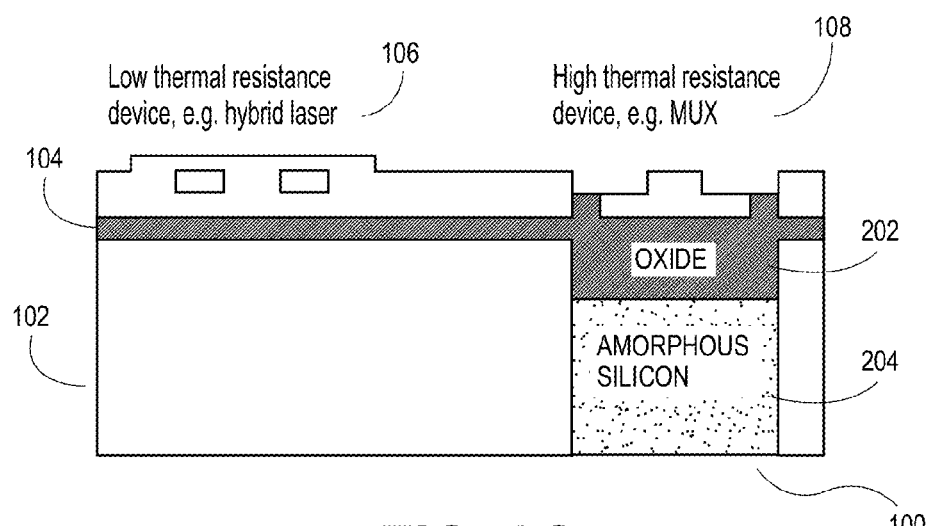

Referring to FIGS. 2A-2C, embodiments of the invention are directed to controlling the thermal resistance of a silicon on insulator (SOI) wafer by patterning the backside of the buried oxide (BOX) layer.

As shown in FIG. 2A, a low resistance thermal device 106, such as a hybrid laser may be formed on one area of the wafer 100 over the oxide layer 104 and adjacent to a high thermal resistance device 108, such as a thermally tuned multiplexer (MUX).

An opening 200 may be created from the backside of the wafer, such as by etching the back of an SOI wafer 100 to expose the buried oxide layer 104. According to embodiments, the present invention enables the ability to tailor the thermal resistance across the wafer or die depending on the device being fabricated. In this case, the opening 200 is positioned under the high thermal resistance device 108. For example, the additional oxide 202 may be 8 μm thick and 20 μm wide to accommodate this particular thermally tuned MUX 108. Of course other thicknesses and dimensions could be used as appropriate. For example, the additional oxide layer may be 2-10 μm thick.

As shown in FIG. 2B, an additional layer of silicon oxide 202 is deposited in the opening 200, thus increasing the local thickness of the oxide layer 104 and thus increasing the local thermal resistance in the area under the high thermal resistance device 108.

As show in FIG. 2C, an amorphous silicon layer 204 is deposited to fill the remainder of the opening 200 shown in FIG. 2B. This amorphous silicon layer may be used to retain the mechanical viability of the wafer 100. The amorphous silicon may then be polished or planarized flush with the bottom of the wafer 100.

Figure 3A:
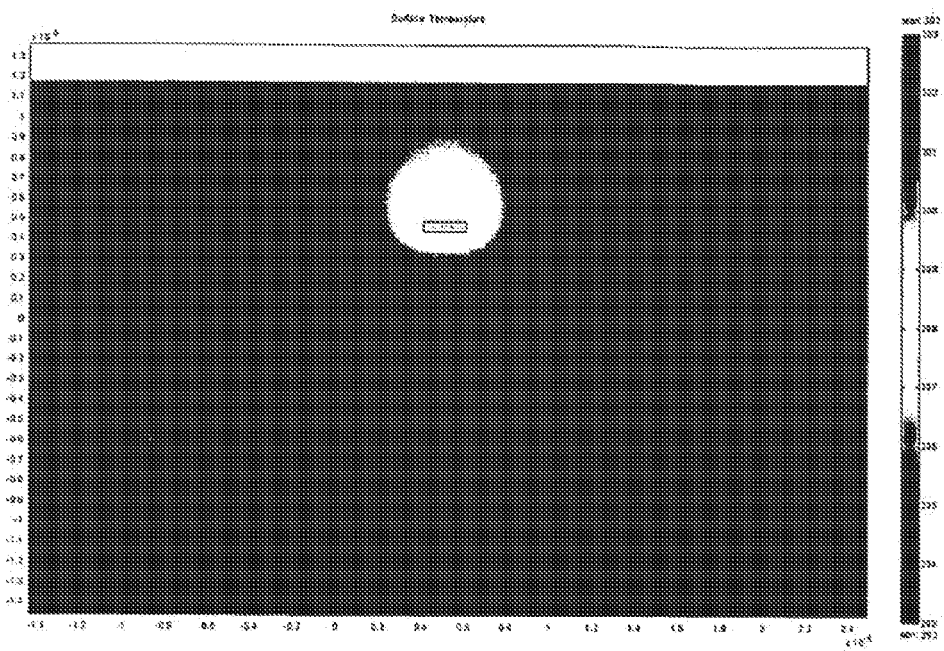
FIGS. 3A and 3B are thermal images showing surface temperature without and with a thicker local oxide layer, respectively.
Figure 3B:
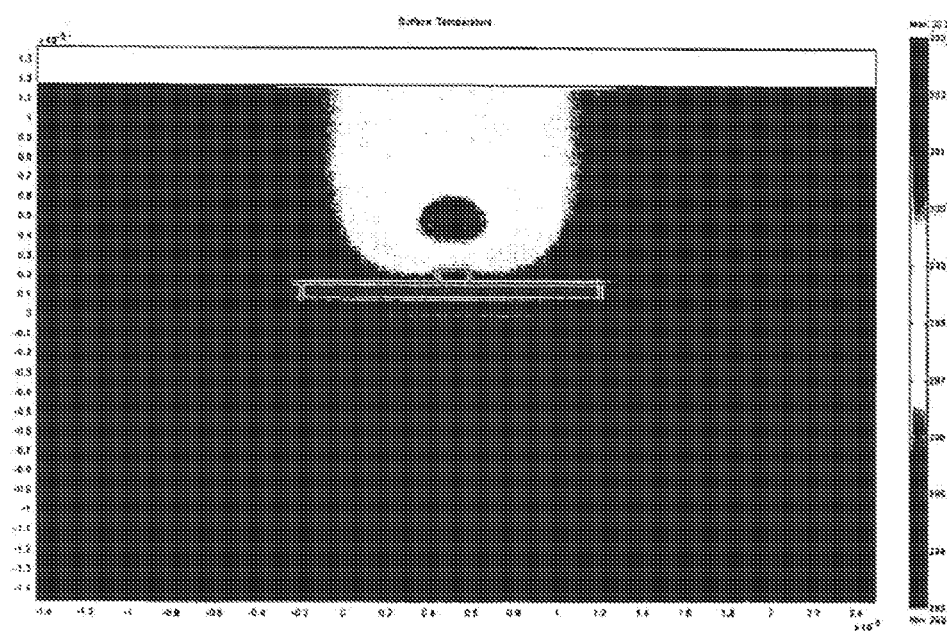

FIGS. 3A and 3B show the calculated temperature distribution when 25 mW of electrical power is dissipated in a heater placed 2 μm above a waveguide for the case when the oxide layer 104 is 1 μm thick (FIG. 3A) and when it is 8 μm thick including the additional oxide 202 (FIG. 3B). As illustrated, temperatures are warmer with the additional oxide.

Figure 4:
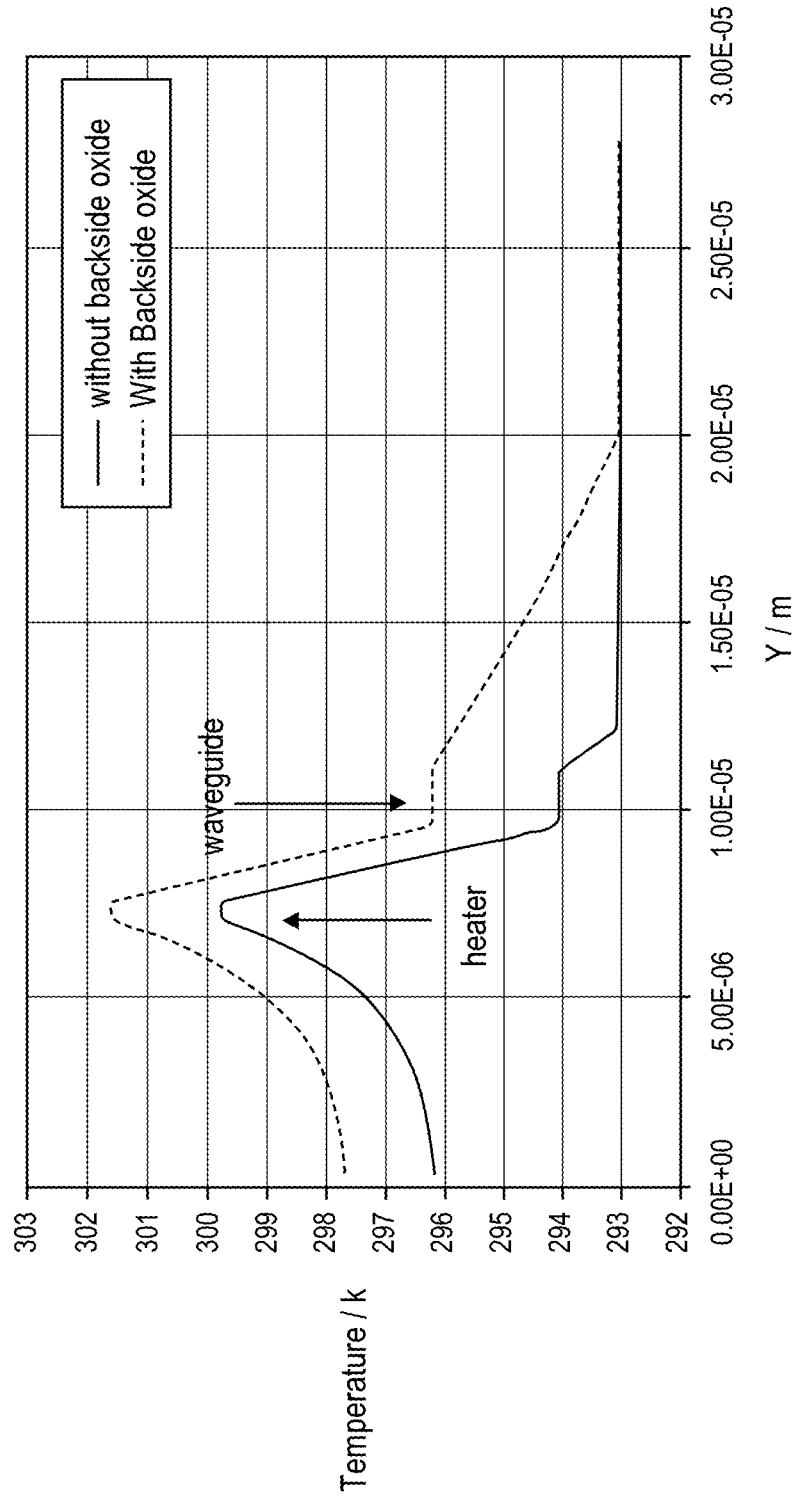
FIG. 4 is a cross sectional scan of the profiles shown in FIGS. 3A and 3B showing the temperature across the device.

This is also shown in FIG. 4, where it can be seen that backside patterning according to embodiments has raised the temperature of the waveguide from 294 k to 296.2 k. This corresponds to a decrease in the power required to produce a pi phase shift via the thermo-optic effect from 98 mW to 31 mW.

In one embodiment of the invention it may be used is in the fabrication of a multi-channel laser system. The SOI wafer may be optimized to reduce the thermal resistance of the lasers on the chip, and backside patterning would be done behind the multiplexer for efficient tuning of this device.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
    a silicon on insulation (SOI) wafer comprising a silicon substrate and a buried oxide layer;
    at least one cavity in a backside of the SOI wafer, the cavity extending through the silicon substrate to the buried oxide layer;
    an additional layer of oxide deposited in the cavity beneath the buried oxide layer; and
    a layer of silicon filling a remainder of the cavity and being flush with the backside of the silicon substrate, wherein the layer of silicon filling the remainder of the opening includes amorphous silicon, wherein the additional layer of oxide provides for a first portion of the SOI wafer a first thermal resistance different than a second thermal resistance for a second portion of the SOI wafer adjoining the first portion.

2. The apparatus as recited in claim 1, further comprising:
    a plurality of devices formed on the SOI wafer, the plurality of devices having different thermal resistance specifications.

3. The apparatus as recited in claim 2 wherein one of the plurality of devices comprises a laser.

4. The apparatus as recited in claim 2 wherein one of the plurality of devices comprises a thermally tuned multiplexer.

5. The apparatus as recited in claim 2 wherein the additional oxide layer is 2-10 µm thick.

6. The apparatus as recited in claim 2 wherein the plurality of devices comprises at least a laser and a thermally tuned device.

7. A silicon on insulation (SOI) wafer having a tailored thermal resistance profile, the SOI wafer comprising:
    a silicon substrate having a buried oxide layer;
    local areas on the backside of the silicon substrate, the local areas comprising respective cavities which each extend through the silicon substrate to the buried oxide layer;
    additional layers of oxide to increase the effective thickness of buried oxide in the local areas, wherein a thickness of the additional layers of oxide provide for a local area thermal profile; and
    a layer of silicon filling a remainder of the local areas and being flush with the backside of the silicon substrate, wherein the layer of silicon comprises amorphous silicon.

8. The (SOI) wafer as recited in claim 7 wherein the additional layers of oxide is 2-10 µm thick.

9. The SOI wafer as recited in claim 8 wherein thermally tuned devices are positioned over the local areas.

* * * * *